United States Patent
Kim

(10) Patent No.: US 7,595,252 B2
(45) Date of Patent: Sep. 29, 2009

(54) METHOD OF MANUFACTURING A SEMICONDUCTOR MEMORY DEVICE

(75) Inventor: Choong Bae Kim, Kyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 295 days.

(21) Appl. No.: 11/295,359

(22) Filed: Dec. 5, 2005

(65) Prior Publication Data
US 2006/0223277 A1 Oct. 5, 2006

(30) Foreign Application Priority Data
Apr. 1, 2005 (KR) .................. 10-2005-0027702

(51) Int. Cl.
*H01L 21/76* (2006.01)
(52) U.S. Cl. .................. 438/424; 438/257; 438/427; 257/E21.546
(58) Field of Classification Search .......... 438/424, 438/427, 257, E21.422, E21.546; 257/E21.546
See application file for complete search history.

(56) References Cited
U.S. PATENT DOCUMENTS

| 5,710,076 | A * | 1/1998 | Dai et al. .................. 438/305 |
| 6,927,447 | B2 * | 8/2005 | Choi et al. .................. 257/315 |
| 7,018,482 | B1 * | 3/2006 | Geomini .................. 134/18 |
| 2002/0090797 | A1 * | 7/2002 | Chen et al. .................. 438/437 |
| 2006/0038220 | A1 * | 2/2006 | Kusters et al. .................. 257/315 |
| 2006/0091482 | A1 * | 5/2006 | Kim et al. .................. 257/401 |

FOREIGN PATENT DOCUMENTS

| CN | 1428846 | 7/2003 |
| CN | 1577865 | 2/2005 |
| JP | 10-065026 | 3/1998 |
| JP | 2002-134634 | 5/2002 |
| KR | 10-2002-0095688 A | 12/2002 |

OTHER PUBLICATIONS

Machine translation JP08-217430.*

* cited by examiner

*Primary Examiner*—Bradley K Smith
(74) *Attorney, Agent, or Firm*—Townsend and Townsend and Crew LLP

(57) ABSTRACT

A method of manufacturing a semiconductor device comprises providing a semiconductor substrate, forming trenches in predetermined regions of the semiconductor substrate, forming isolation structures within the trenches that separate active regions and field regions of the device, and etching exposed regions of the semiconductor substrate so that the exposed regions of possess a curved surface. In a specific embodiment of the invention, an oxidization process is performed to compensate for damage on the exposed regions of the semiconductor substrate after etching the semiconductor substrate, and a wet etch process is performed to remove an oxide layer grown by the oxidization process. In a specific embodiment of the invention, the etch process may comprise a wet or dry etch process.

18 Claims, 2 Drawing Sheets

METHOD OF MANUFACTURING A SEMICONDUCTOR MEMORY DEVICE

BACKGROUND OF THE INVENTION

The present invention is directed to integrated circuits and their processing for the manufacture of semiconductor devices. More particularly, the invention provides a novel trench isolation structure and method used for electrical isolation in semiconductor devices.

As the level of integration of semiconductor devices is gradually increased, isolation areas can be used to partition an active region and field region within a specific device. Isolation areas can be formed by a Shallow Trench Isolation (STI) process, where the STI process is a method of forming a trench in a predetermined region of a semiconductor substrate where the trench is subsequently filled with an oxide layer to form an isolation structure.

As the level of integration of semiconductor devices such as NAND flash memory devices is increased, the area of the active region that helps to determine the characteristics of the device is gradually reduced. Although the STI process is employed to improve electrical isolation, the pitch of the active region and the field region becomes smaller as the integration of the device is increased. Therefore, to ensure uniform electrical characteristics of devices formed using the STI process, the area of the active region must be increased.

However, void formation can occur if the area of the active region is increased without increasing the overall area of the device. This can happen where a gapfill process takes place as the field region becomes progressively smaller. In contrast, if the area of the field region is increased, the area of the active region becomes smaller which may have an adverse effect on the electrical characteristics of the devices being formed in these regions.

A method of manufacturing a semiconductor device and more particularly a flash memory device could be provided where the yield of the device is improved by increasing the area of an active region without increasing the overall area of the device.

BRIEF SUMMARY OF THE INVENTION

The present invention is directed to integrated circuits and their processing for the manufacture of semiconductor devices. More particularly, the invention provides a novel trench isolation structure and method used for electrical isolation in semiconductor devices. Merely by way of example, the invention has been applied to the manufacture of flash memory devices, such as NOR or NAND flash memory devices. A person skilled in the art would recognize that the invention has a much broader range of applicability. For example, the invention can be applied to microprocessor devices, logic circuits, application specific integrated circuit devices, as well as various other structures.

In an exemplary embodiment of the invention, a method of manufacturing a semiconductor device is provided. The method comprises providing a semiconductor substrate, forming trenches in predetermined regions of the semiconductor substrate, forming isolation structures within the trenches that separate active regions and field regions of the device, and etching exposed regions of the semiconductor substrate so that the exposed regions possess a curved surface.

In a specific embodiment of the invention, the step of forming trenches in the semiconductor substrate comprises forming a pad oxide layer overlying the semiconductor substrate, forming a pad nitride layer overlying the pad oxide layer, patterning the pad oxide layer and pad nitride layer to expose trench openings in the semiconductor substrate; and performing an anisotropic etch process to remove portions of the semiconductor substrate at the trench openings.

In a specific embodiment of the invention, the method further comprises performing an oxidization process to compensate for damage to the exposed regions of the semiconductor substrate after etching the exposed regions semiconductor substrate, and performing a wet etch process to remove an oxide layer grown on the exposed regions of the semiconductor substrate by the oxidization process.

In a specific embodiment of the invention, the method further comprises forming a tunnel oxide layer and a first conduction layer overlying the semiconductor substrate and isolation structures, patterning the tunnel oxide layer and the first conduction layer to form a floating gate, forming a second dielectric layer overlying the first conduction layer and isolation structures, forming a second conduction layer overlying the second dielectric layer; and patterning the second conduction layer to form a stack gate in which a control gate is formed adjacent to the floating gate.

Many benefits are achieved by way of the present invention over conventional techniques. For example, the present technique provides an easy to use process that relies upon conventional technology. In some embodiments, a method of manufacturing a trench isolation structure in a semiconductor device is provided in which the area of an active region is increased while maintaining the area of a field region and the overall area of the device. In some embodiments, the area of an active region is increased by etching the semiconductor substrate within the active region to form a curved surface structure. In some embodiments, the area of the active region is increased while maintaining the same level of integration and improving the electrical properties of the device. Additionally, the method provides a process that is compatible with conventional process technology without substantial modifications to conventional equipment and processes. Depending upon the specific embodiment, one or more of these benefits may be achieved. These and other benefits will be described in more throughout the present specification and more particularly below.

Various additional features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a novel trench isolation structure and method used for electrical isolation in semiconductor devices. Merely by way of example, the invention has been applied to the manufacture of flash memory devices, such as NOR or NAND flash memory devices. A person skilled in the art would recognize that the invention has a much broader range of applicability. For example, the invention can be applied to microprocessor devices, logic circuits, application specific integrated circuit devices, as well as various other structures.

Figure 1A:
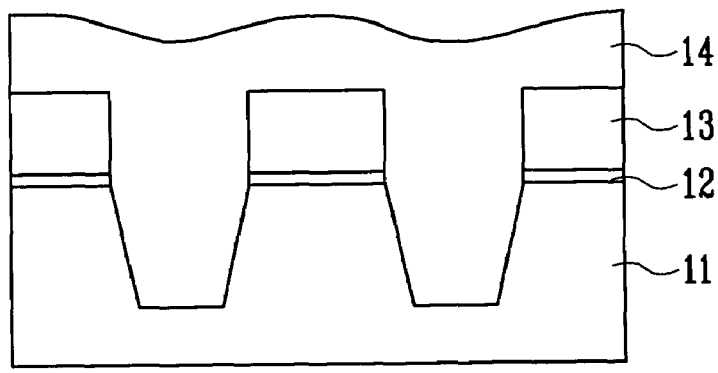
FIGS. 1a to 1d are simplified exemplary cross-sectional views of semiconductor devices illustrating a method of manufacturing the device according to an embodiment of the present invention.

Referring to FIG. 1a, a pad oxide layer 12 and a pad nitride layer 13 are formed overlying a semiconductor substrate 11. Predetermined regions of pad nitride layer 13 and pad oxide layer 12 are removed by photolithography and etch processes using an isolation mask for partitioning an active region and a field region. This exposes trench openings in the semiconductor substrate, where exposed portions of semiconductor substrate 11 are etched at a predetermined depth to form trenches. In a specific embodiment, the sidewalls of the trenches are angled. After a wall oxide film (not shown) is formed on sidewalls of the trenches, an isolation layer 14 is formed overlying the trenches and mesa regions so that the trenches are filled.

Figure 1B:
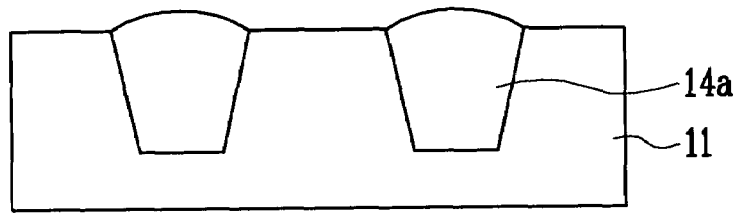

Referring to FIG. 1b, isolation layer 14 is polished to remove portions of isolation layer 14 and expose pad nitride film 13. Pad nitride film 13 and pad oxide film 12 are then removed. A cleaning process is then performed to shape isolation regions 14a within the trenches.

Figure 1C:
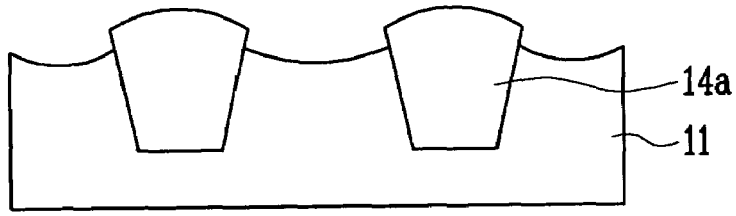

Referring to FIG. 1c, semiconductor substrate 11 is etched so that a surface of semiconductor substrate 11 becomes a curved surface, which increases the area of the active region accordingly. To create a curved surface of semiconductor substrate 11, a wet or dry etch process can be used. In the case where a dry etch process is used, a blanket dry etch process may be performed, or a polysilicon hard mask can be formed on the field region and the dry etch process subsequently performed after the hard mask has been formed. In a specific embodiment of the invention, a silicon etch process is used. An etch gas may employ $Cl_2$, HBr, $CF_4$, $SF_6$, $O_2$, Ar or other gases as the echant. In a specific embodiment, an oxidization process is performed to compensate for damage on the exposed areas of the semiconductor substrate 11 exposed by the etch process, and a wet etch process for removing an oxide film grown by the oxidization process is then performed.

Figure 1D:
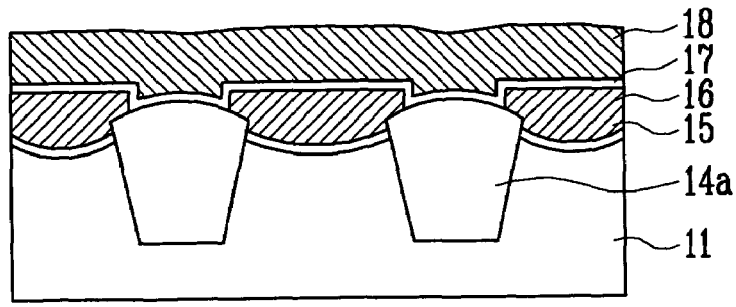

Referring to FIG. 1d, a tunnel oxide layer 15 and a first conduction layer 16 are formed overlying semiconductor substrate 11 and insulation regions 14a. Tunnel oxide layer 15 and first conduction layer 16 are patterned to form a floating gate. A dielectric layer 17 is formed overlying first conduction layer 16 and insulation regions 14a. A second conduction layer 18 is formed overlying the second dielectric layer and then patterned to form a stack gate in which a floating gate and a control gate are formed. In a specific embodiment of the invention, patterning the tunnel oxide layer and first conduction layer exposes the insulation regions. In a specific embodiment of the invention, the floating gate and control gate are formed adjacent to each other.

FIGS. 2a to 2d are exemplary simplified cross-sectional views of semiconductor devices for illustrating a method of manufacturing the device according to another embodiment of the present invention. An active region of a semiconductor substrate is etched to a greater depth than the height of a floating gate so that the floating gate is formed between isolation layers, thus forming a curved surface.

Figure 2A:
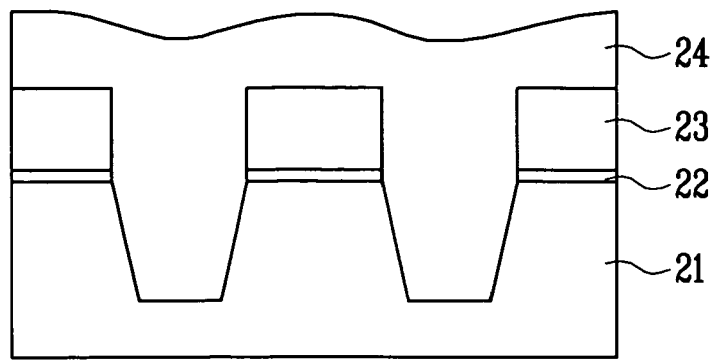
FIGS. 2a to 2d are simplified exemplary cross-sectional views of semiconductor devices for illustrating a method of manufacturing the device according to another embodiment of the present invention.

Referring to FIG. 2a, a pad oxide layer 22 and a pad nitride layer 23 are formed overlying a semiconductor substrate 21. Predetermined regions of pad nitride layer 23 and pad oxide layer 22 are removed by photolithography and etch processes using an isolation mask for partitioning an active region and a field region. This exposes trench openings in the semiconductor substrate, where exposed portions of semiconductor substrate 21 are etched at a predetermined depth to form trenches. In a specific embodiment, the sidewalls of the trenches are angled. After a wall oxide film (not shown) is formed on sidewalls of the trenches, an isolation layer 24 is formed overlying the trenches and mesa regions so that the trenches are filled.

Figure 2B:
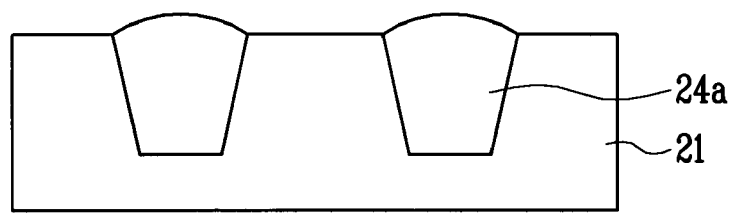

Referring to FIG. 2b, isolation layer 24 is polished to remove portions of isolation layer 24 expose pad nitride film 23. Pad nitride film 23 and pad oxide film 22 are then removed. A cleaning process is then performed to shape isolation structures 24a within the trenches.

Figure 2C:
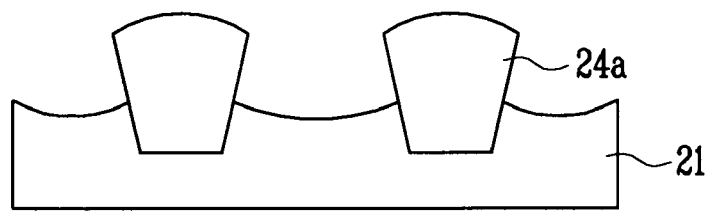

Referring to FIG. 2c, the exposed areas of semiconductor substrate 21 are etched so that the surface of semiconductor substrate 21 becomes a curved surface. The exposed area of semiconductor substrate 21 is etched to a greater depth than the height of a floating gate formed by subsequent processes so that the floating gate is formed between isolation layers 24a. To etch the exposed areas of semiconductor substrate 21 to a greater depth than the height of the floating gate and form a curved surface on semiconductor substrate 21, a wet or dry etch method can be used. In the case where a dry etch process is used, a blanket dry etch process may be performed, or a polysilicon hard mask can be formed on the field region and the dry etch process subsequently performed after the hard mask has been formed. In a specific embodiment of the invention, a silicon etch process is used. An etch gas may employ $Cl_2$, HBr, $CF_4$, $SF_6$, $O_2$, Ar or other gases as the echant being used. In a specific embodiment, an oxidization process is performed to compensate for damage on the exposed areas of the semiconductor substrate 11 exposed by the etch process, and a wet etch process for removing an oxide film grown by the oxidization process is then performed.

Figure 2D:
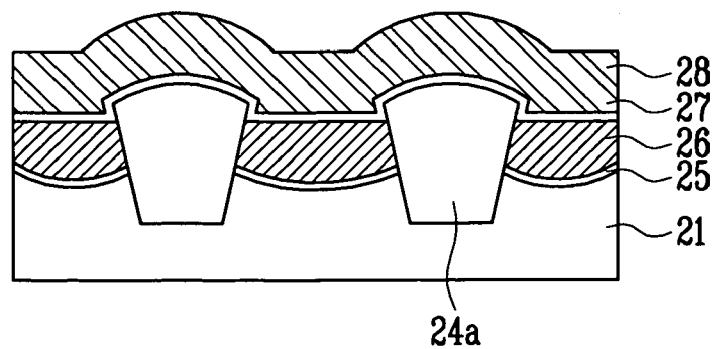

Referring to FIG. 2d, a tunnel oxide layer 25 and a first conduction layer 26 are formed overlying semiconductor substrate 21 and insulation regions 24a. Tunnel oxide layer 25 and first conduction layer 26 are patterned to form a floating gate. A dielectric layer 27 is formed overlying first conduction layer 26 and the insulation regions 24a. A second conduction layer 28 is formed overlying the second dielectric layer and then patterned to form a stack gate in which a floating gate and a control gate are formed. Thus, the floating gate is formed so that floating gate is isolated between isolation layers 24a. In a specific embodiment of the invention, patterning the tunnel oxide layer and first conduction layer exposes the insulation regions. In a specific embodiment of the invention, the floating gate and control gate are formed adjacent to each other.

According to the present invention, an active region of a semiconductor substrate is etched to a predetermined depth so that it has a curved surface. The area of the active region can be increased while not reducing the area of a field region or increasing the overall area of the device being formed. The level of integration of a semiconductor device can be enhanced and electrical properties of the device can be improved as a result, thus providing a more stable device.

Although the foregoing description has been made with reference to the specific embodiments, it is to be understood that changes and modifications of the present invention may be made by the ordinary skilled in the art without departing from the spirit and scope of the present invention.

What is claimed is:

1. A method of manufacturing a semiconductor device comprising:
    providing a semiconductor substrate;
    forming trenches in the semiconductor substrate;
    forming isolation structures within the trenches, wherein the isolation structures separate active regions and field regions of the device;

etching the active regions to a predetermined depth, wherein a height of a center surface of each active region is lower than a height of an edge surface of each active region; and forming a tunnel oxide layer and a floating gate over the active regions, wherein the predetermined depth is greater than a height of the floating gate.

2. The method of claim 1, wherein the forming trenches step comprises:

forming a pad oxide layer overlying the semiconductor substrate;

forming a pad nitride layer overlying the pad oxide layer;

patterning the pad oxide layer and pad nitride layer to expose trench openings in the semiconductor substrate; and performing an anisotropic etch process to remove portions of the semiconductor substrate at the trench openings.

3. The method of claim 1, wherein the step of forming isolation structures comprises:

depositing a dielectric layer over the trenches and mesa regions adjacent to the semiconductor substrate;

patterning the dielectric layer to expose a pad nitride layer overlying a pad oxide layer on the semiconductor substrate;

removing the pad nitride and the pad oxide layers; and performing a cleaning process.

4. The method of claim 1 wherein the topmost portion of the isolation structures possess a rounded profile.

5. The method of claim 1, wherein the sidewalls of the trenches are angled.

6. The method of claim 1, wherein etching the active regions of the semiconductor substrate is performed by a wet or dry etch process.

7. The method of claim 6, wherein the dry etch process is a blanket etch process.

8. The method of claim 6, wherein the dry etch process is performed using $Cl_2$, HBr, $CF_4$, $SF_6$, $O_2$ or Ar gas.

9. The method of claim 1, further comprising:

performing an oxidization process to compensate for damage to exposed regions of the semiconductor substrate after etching the exposed regions of the semiconductor substrate; and performing a wet etch process to remove an oxide layer grown on the exposed regions of the semiconductor substrate as a result of the oxidization process.

10. The method of claim 1, further comprising:

forming the tunnel oxide layer and a first conduction layer overlying the semiconductor substrate and the isolation structures;

patterning the tunnel oxide layer and the first conduction layer to form the floating gate;

forming a dielectric layer overlying the first conduction layer and the isolation structures;

forming a second conduction layer overlying the dielectric layer; and patterning the second conduction layer to form a stack gate in which a control gate is formed adjacent to the floating gate.

11. The method of claim 10, wherein patterning the tunnel oxide layer and the first conduction layer exposes portions of the isolation structures.

12. A method of manufacturing a semiconductor device comprising:

providing a semiconductor substrate;

forming trenches in the semiconductor substrate;

forming isolation structures within the trenches, wherein the isolation structures separate active regions and field regions of the device;

etching the active regions of the semiconductor substrate so that the active regions have a curved surface which curves down;

forming a tunnel oxide layer and a first conduction layer overlying the semiconductor substrate and the isolation structures;

patterning the tunnel oxide layer and the first conduction layer to form a floating gate;

forming a dielectric layer overlying the first conduction layer and the isolation structures;

forming a second conduction layer overlying the dielectric layer; and patterning the second conduction layer to form a stack gate in which a control gate is formed adjacent to the floating gate;

wherein the active regions of the semiconductor substrate are etched to a predetermined depth, the predetermined depth being a depth that is greater than a height of the floating gate.

13. The method of claim 12, wherein the forming trenches step comprises:

forming a pad oxide layer overlying the semiconductor substrate;

forming a pad nitride layer overlying the pad oxide layer;

patterning the pad oxide layer and pad nitride layer to expose trench openings in the semiconductor substrate; and performing an anisotropic etch process to remove portions of the semiconductor substrate at the trench openings.

14. The method of claim 12, wherein the step of forming isolation structures comprises:

depositing a dielectric layer over the trenches and mesa regions adjacent to the semiconductor substrate;

patterning the dielectric layer to expose a pad nitride layer overlying a pad oxide layer on the semiconductor substrate;

removing the pad nitride layer and the pad oxide layer; and performing a cleaning process.

15. The method of claim 12, wherein the topmost portion of the isolation structures possess a rounded profile.

16. The method of claim 12, wherein the sidewalls of the trenches are angled.

17. The method of claim 12, wherein etching the active regions of the semiconductor substrate is performed by a wet or dry etch process, wherein the dry etch process is a blanket etch process using $Cl_2$, HBr, $CF_4$, $SF_6$, $O_2$ or Ar gas.

18. The method of claim 12, further comprising:

performing an oxidization process to compensate for damage to exposed regions of the semiconductor substrate after etching the exposed regions of the semiconductor substrate; and performing a wet etch process to remove an oxide layer grown on the exposed regions of the semiconductor substrate as a result of flue oxidization process.

* * * * *